United States Patent [19]

Wintermute

[11] 4,275,349
[45] Jun. 23, 1981

[54] WATT AND VAR TRANSDUCER

[75] Inventor: Joseph T. Wintermute, Mountainside, N.J.

[73] Assignee: Westinghouse Electric Corp., Pittsburgh, Pa.

[21] Appl. No.: 38,362

[22] Filed: May 11, 1979

[51] Int. Cl.³ .......................................... G01R 21/00
[52] U.S. Cl. ...................................... 324/141; 324/142
[58] Field of Search ................ 324/141, 142; 364/483; 235/92 EL

[56] References Cited

U.S. PATENT DOCUMENTS

| 4,027,241 | 5/1977 | Jauch | 324/142 |
| 4,055,803 | 10/1977 | Kraley et al. | 324/142 |
| 4,056,775 | 11/1977 | Milkovic | 324/142 |
| 4,131,847 | 12/1978 | Kohga et al. | 324/141 |
| 4,182,983 | 1/1980 | Heinrich et al. | 324/142 |

Primary Examiner—Stanley T. Krawczewicz
Attorney, Agent, or Firm—D. R. Lackey

[57] ABSTRACT

A watt and var transducer which alternately generates each function in response to commonly shared time division multiplication circuitry, and which provides a continuous indication of watt and vars via separate filtering and amplifier output stages.

8 Claims, 2 Drawing Figures

WATT AND VAR TRANSDUCER

BACKGROUND OF THE INVENTION

1. Field of the Invention

The invention relates in general to measuring devices or transducers, and more specifically to transducers for measuring active power or watts, and reactive power or vars, of an alternating current circuit.

2. Description of the Prior Art

U.S. Pat. No. 4,027,241, which is assigned to the same assignee as the present application, and which has now been dedicated to the public, discloses a watt transducer based upon the pulse width-pulse height multiplication principle. A pulse width modulated signal responsive to the instantaneous value of the circuit voltage is used to reverse the output terminals of a current transformer which measures the circuit current. Thus, a train of pulses of alternating polarity is produced, with their height being proportional to the instantaneous measured current, and their width being proportional to the instantaneous measured potential. The average value of the current pulses is proportional to power. The train of current pulses is filtered and applied to a constant current output amplifier, which eliminates the need for zero adjustment.

In addition to measuring active power or watts, it is often desirable to measure reactive power or vars, especially in unbalanced polyphase circuits. It would be desirable to utilize the time division multiplication principle of the hereinbefore mentioned U.S. Patent, as well as the switched current transformer embodiment set forth in this patent, to simultaneously provide an indication of circuit watts and vars. It would also be desirable to provide these functions while minimizing circuit components and thus power supply requirements.

SUMMARY OF THE INVENTION

Briefly, the present invention is a new and improved watt and var transducer which alternately produces signals indicative of circuit watts and vars via commonly shared time division multiplication circuitry, while continuously and simultaneously providing output signals responsive to both circuit watts and vars. First and second pulse width modulated signals are provided in response to the circuit voltage, and to the circuit voltage phase shifted by 90°, respectively. The first and second pulse width modulated signals are alternately applied to a current modulator which includes a current transformer and switch means for alternately reversing the output of the current transformer in response to the pulse width modulated signal applied thereto at any instant. Watt and var output circuits, each including filter and amplifier stages, are alternately responsive to the output of the current modulator such that the watt output circuit receives the output of the current modulator when it is being switched by the first pulse width modulated signal, and the var output circuit receives the output of the current modulator when it is being switched by the second pulse width modulated signal. Circuit timing starts from a single square wave signal, assuring proper synchronization between the pulse width modulator signals, the current modulator, and the output circuits.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF PREFERRED EMBODIMENTS

Figure 1:
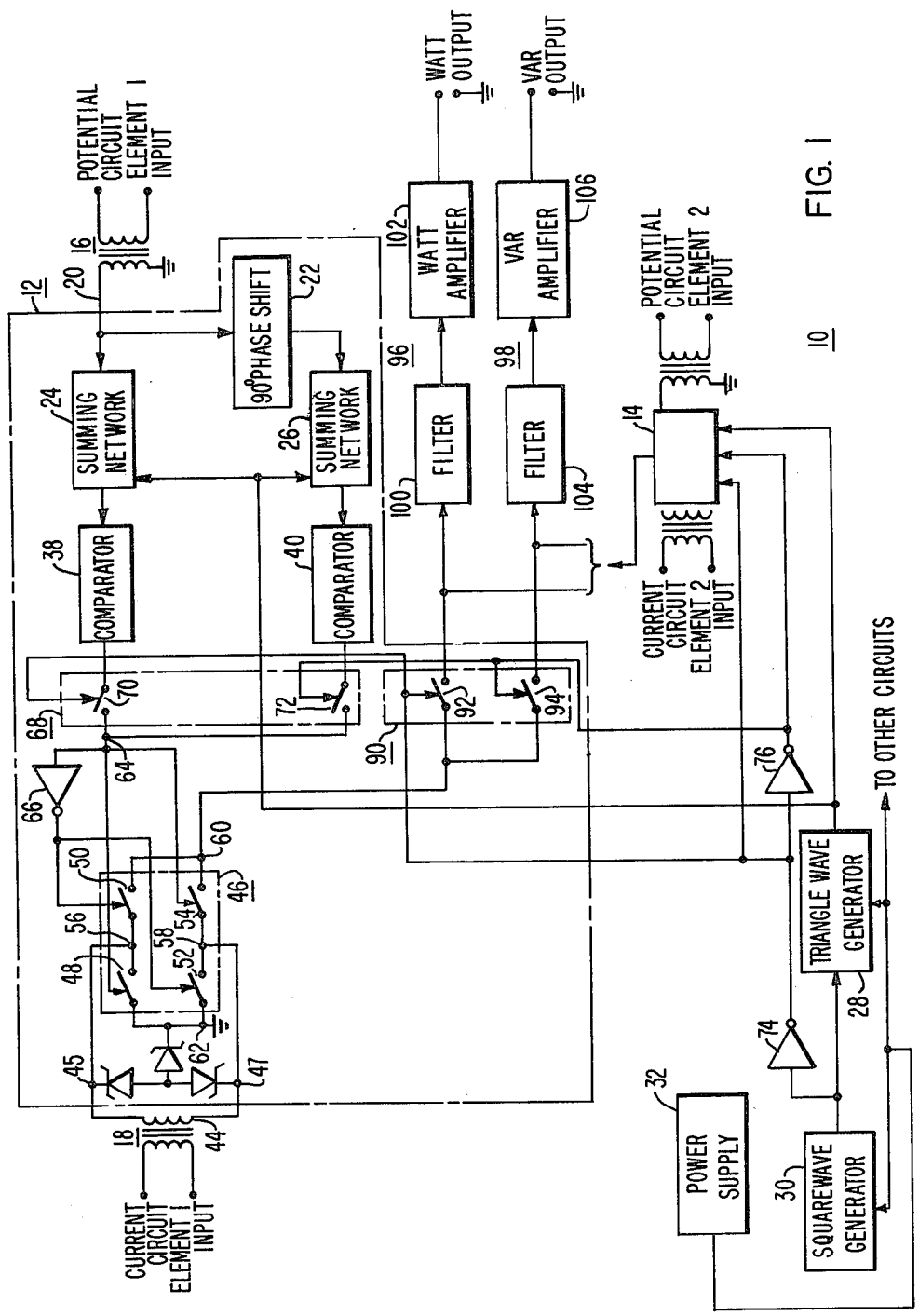
FIG. 1 is a schematic diagram of a watt and var transducer constructed according to the teachings of the invention.

Referring now to the drawings, and to FIG. 1 in particular, there is shown a new and improved watt and var transducer 10 constructed according to the teachings of the invention. Circuit functions which may be provided by detailed circuitry shown in U.S. Pat. No. 4,027,241 are shown in block form in FIG. 1, in order to simplify the drawing. Accordingly, U.S. Pat. No. 4,027,241 is hereby incorporated into the present application by reference.

Watt and var transducer 10 includes one, two or three elements, depending upon the configuration of the alternating current circuit to be measured. Since each element would be of like construction, only a single element 12 is shown in detail. A second element is indicated generally at 14, in order to illustrate how its output would be added to the output of the first element. A third element would be connected as illustrated for the second element 14.

The first element 12 is responsive to the voltage and current quantities of an alternating current circuit whose active and reactive power is to be measured via a potential transformer 16, and a current transformer 18, respectively. Potential transformer 16 includes a secondary or output winding 20 which provides a first voltage signal responsive to the instantaneous alternating current voltage of the alternating current circuit. This first voltage signal is applied to a 90° phase shift circuit 22, such as an RC circuit, with the output of the phase shift circuit 22 providing a second voltage signal which is similar to the first voltage signal but shifted 90° in phase therefrom.

The first voltage signal is mixed or summed with a triangle wave signal in a summing network 24, such as via resistors connected to a common junction. In like manner, the second voltage signal is summed with the same triangle wave signal in a summing network 26.

The triangle wave signal is provided by a triangle wave generator 28, in response to a square wave signal provided by a square wave generator 30. Square wave generator 30 and triangle wave generator 28 collectively may be provided by the triangle wave generator shown in detail in the incorporated patent. The functions are illustrated separately in the present application, as the square wave from which the triangle wave is generated is used for additional timing functions in the present application, as will be hereinafter explained.

A regulated power supply 32 is provided in order to assure the development of precision triangular wave signals having linear sides and a precisely regulated amplitude, as well as the development of a regulated square wave signal. As shown and described in the incorporated patent, the power supply 32 provides two complementary voltage levels. One set is a low voltage, i.e., +6.3 volts and −6.3 volts, which supplyn certain CMOS logic circuitry used in a preferred embodiment of the invention. This set is precisely regulated by operational amplifiers and referenced to a temperature compensated Zener diode. The other set of voltages, such as +16 volts and −16 volts, which may be regulated by Zener diodes and transistors, supplies the circuit amplifiers.

Figure 2:
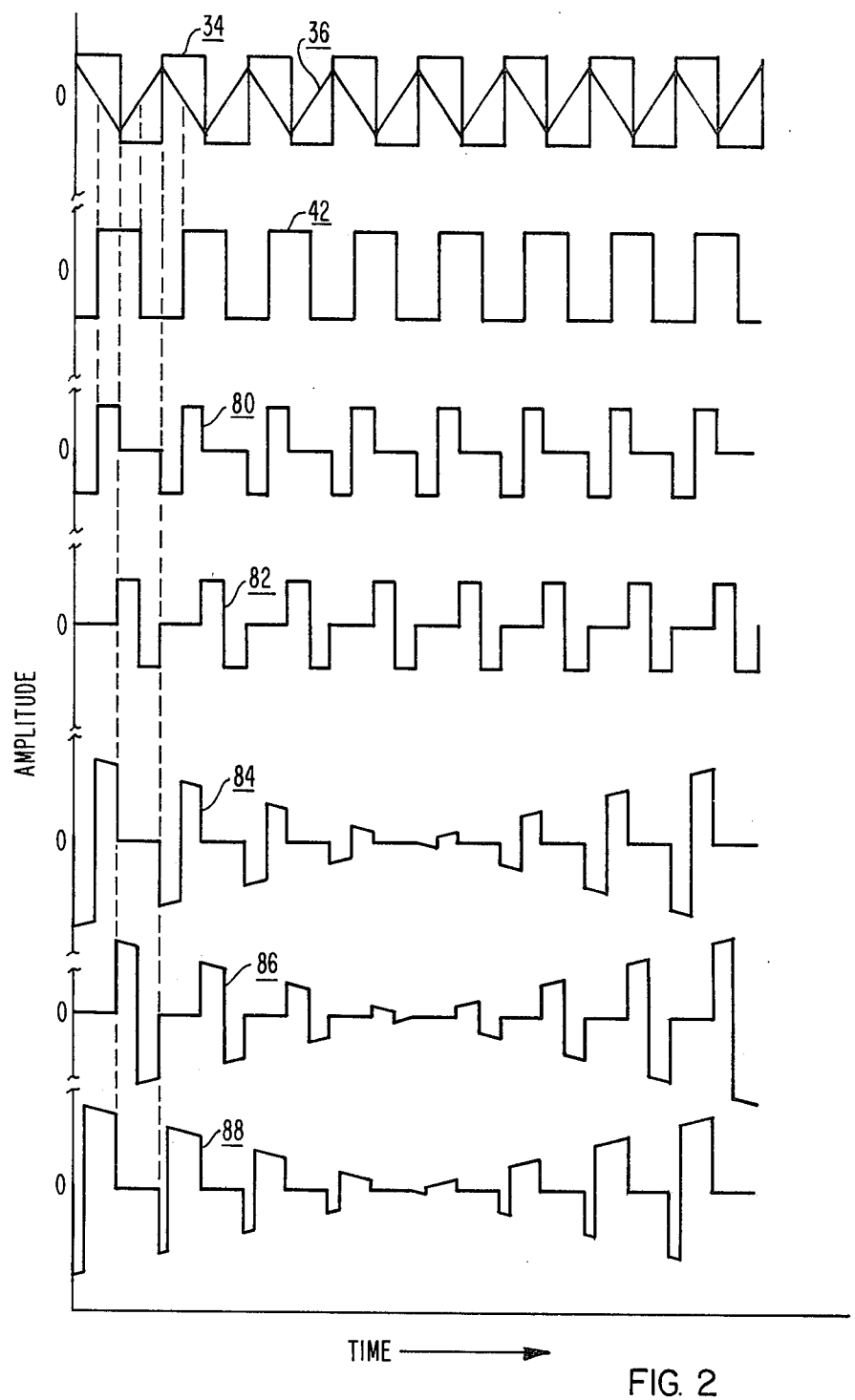
FIG. 2 is a graph which sets forth a plurality of time related signal waveforms useful in understanding the invention.

FIG. 2 is a graph containing certain signal waveforms useful in understanding the invention, and it will be referred to in order to illustrate the time relationships between important signals of the transducer. For example, signal waveform 34 illustrates the square wave signal provided by square wave generator 30, and signal waveform 36 illustrates the triangle waveform provided by the triangle waveform generator 28.

It is important to note that the triangle wave signal 36 must have a higher frequency and amplitude than the frequency and amplitude of the first and second voltage signals and which it is summed, such that the value of the associated voltage signal will change very little during one cycle of the triangle wave, and such that the mixed voltage and triangle wave signals will provide a composite waveform having zero crossings, with the voltage signal shifting the zero crossing points of the composite waveform. This is clearly illustrated in the graph of FIG. 5 of the incorporated patent.

The composite signals provided by the summing networks 24 and 26 are applied to comparators 38 and 40, respectively. Comparators 38 and 40, which may each include an inverter as illustrated in the incorporated patent, or an op amp comparator, change their output state at the zero crossings of the composite input signals. The composite triangular wave rises and falls linearly with time, so that the shift in the triangle wave with respect to its zero axis in response to the voltage signal is converted to a linear modulation of the on-off state of the inverter or op amp comparator. Since the voltage signal is substantially constant during one cycle of the triangle wave, comparators 38 and 40 provide pulse width modulated signals which indicate the instantaneous value of the first and second voltage signals, respectively. FIG. 6 of the incorporated patent illustrates the development of the pulse width modulated signal from the composite waveform of a triangle wave and a voltage signal.

Waveform 42 in FIG. 2 of the present application illustrates how the output of comparators 38 and 40 would appear without modification by the first and second voltage signals, respectively. In this instance, the pulse width modulated signals have uniform pulse widths as the triangle wave is not shifted relative to its zero axis. It is convenient to describe the invention without voltage displacement of the triangle wave, as the pulse frequency at the output of comparators 38 and 40 is the same with, or without, voltage modification of the triangle wave signal. It is only the pulse width that changes.

Current transformer 18 includes a secondary or output winding 44 having output terminals 45 and 47 which provide a current signal responsive to the current quantity of the associated alternating current circuit. The output terminals 45 and 47 of secondary winding 44 are connected to switching means 46. Switching means 46 includes four controllable switches 48, 50, 52, and 54, such as may be provided by RCA's quad bi-lateral switch CD 4016. The four switches are connected to provide a bridge circuit having input terminals 56 and 58 connected to the output terminals 45 and 47, respectively, of secondary winding 44, and output terminals 60 and 62. The control inputs of the four switches are connected to a circuit which includes an input terminal 64 and an inverter 66. Input terminal 64 is connected directly to the control inputs of switches 48 and 54, and it is connected to the control inputs of switches 50 and 52 via inverter 66. Thus, when input terminal 64 is high, switches 48 and 54 are conductive, connecting output terminal 47 of current transformer 18 to output terminal 60; and, when input terminal 64 is low, switches 50 and 52 are conductive, connecting output terminal 45 of current transformer 18 to output terminal 60.

The outputs of comparators 38 and 40 are connected to input terminal 64 via switching means 68 which includes two controllable switches 70 and 72. Switches 70 and 72 connect the outputs of comparators 38 and 40, respectively, to input terminal 64. The control inputs to switches 70 and 72 are connected to a circuit which includes inverters 74 and 76 and square wave generator 30. Inverter 74 is connected to the output of square wave generator 30, such as to the output of amplifier 22 shown in FIG. 1 of the incorporated patent. The output of inverter 74 is connected to the control input of switch 70, and also to the input of inverter 76. The output of inverter 76 is connected to the control input of switch 72. Thus, switches 70 and 72 alternately connect the outputs of comparators 38 and 40 to input terminal 64 at the frequency of the square wave and thus at the frequency of the triangle wave.

Square wave 34 shown in FIG. 2 may be used to represent the output of inverter 74, since the input section of the triangle wave generator 28 also includes an inverter, and the complement of square wave 34 would represent the output of inverter 76.

Referring now to FIG. 2, switch 70 will be conductive during the positive half cycle of square wave 34. The output signal from comparator 38, and thus the signal appearing at the input of switch 70, is represented by signal 42. Thus, the portion of waveform 42 which will appear at input terminal 64 is shown by waveform 80. In like manner, switch 72 will be conductive during the negative half cycle of square wave 34, since inverter 76 will invert waveform 34. Waveform 42 also represents the output of comparator 40, as waveform 42 is the result of the triangle waveform without voltage modification. The portion of waveform 42 which will appear at input terminal 64 is shown by waveform 82. It will be noted that each of the signals 80 and 82 include a positive and a negative portion, which is essential to the proper operation of switching means 46. Voltage modification of waveform 42 by the first and second voltage signals will change the widths of the positive and negative portions in response to the voltage magnitude. Thus, when switch 70 is conductive, the current signal will be modulated in response to the output of comparator 38, and thus in response to the first voltage signal, and when switch 72 is conductive the current signal will be modulated in response to the second voltage signal and thus to the second or phase shifted voltage. Waveform 84 in FIG. 2 illustrates the output signal which appears at output terminal 60 of the current modulator, if this output terminal were to be sampled only during the time that switch 70 is conductive. Waveform 86 in FIG. 2 illustrates the output signal appearing at output terminal 60 of the current modulator, if this output were to be sampled only when switch 72 is conductive. Waveform 88 represents how waveform 84 would be modified under actual operating conditions wherein the triangle wave position relative to zero would be modified by the first voltage signal. It will be noted that the frequency of waveform 88 is the same of that of waveform 84, but that the relative widths of the positive and negative half cycles have changed to indicate voltage magnitude. Thus, waveform 88 represents active power of the alternating current circuit being measured. In like manner, a waveform similar to waveform 86 would be generated which has different width positive and negative half cycles responsive to the phase shifted voltage. This waveform would represent reactive power or vars.

Such sampling of output terminal 60 is provided by switching means 90 which includes two controllable switches 92 and 94. Thus, the four switches of switching means 68 and 90 may be provided by RCA's quad bi-lateral switch CD4016. Switch 92 is controlled by an input of inverter 74, the same as switch 70, and switch 94 is controlled by the output of inverter 76, the same as switch 72. Thus, the outputs of switches 92 and 94 are responsive to watts and vars, respectively.

The outputs of switches 92 and 94 are connected to first and second output circuits 96 and 98, respectively. Each of the output circuits includes a low pass filter and an amplifier, such as filter 100 and amplifier 102 in the first output circuit 96, and filter 104 and amplifier 106 in the second output circuit 98. The pulses in each current envelope 84 and 86 are integrated in filters 100 and 104, respectively, to provide current signals responsive to watts and vars, respectively, while simultaneously removing switching transients and A.C. products of multiplication. For example, as explained in the incorporated application, the watt component is provided by the product of:

$$[E \sin (\omega t)][I \sin (\omega t - \theta)] \quad (1)$$

which reduces to:

$$EI/2[\cos \theta - \cos (2\omega t - \theta)] \quad (2)$$

The second harmonic component $(2\omega t - \theta)$ is filtered out and the output of filter 100 will thus be $EI/2 \cos \theta$, which thus is directly proportional to the circuit active or real power measured in watts.

In like manner, the var component is provided by the product of:

$$[E \sin (\omega t - 90)] [I \sin (\omega t - \theta)] \quad (3)$$

which is the same as:

$$[E \cos \omega t] [I \sin (\omega t - \theta)] \quad (4)$$

which reduces to:

$$EI/2 [\sin \theta + \sin (2\omega t - \theta)] \quad (5)$$

Filter 104 removes the component $(2\omega t - \theta)$, leaving $EI/2 \sin \theta$ at its output, which is thus directly proportional to the reactive power or vars.

The outputs of filters 100 and 104 are thus D.C. current signals proportional to watts and vars, respectively. They are current signals since the secondary winding 44 of current transformer 18 provides the signal for filters 100 and 104. As explained in the incorporated patent, amplifiers 102 and 106 are preferably constant current amplifiers, in order to eliminate the need for zero adjustment. If such amplifiers are not used, the outputs of filters 100 and 104 would only be able to drive low impedance loads, unless large, costly current transformers are used. Also, amplifiers 102 and 106 act as buffer amplifiers between the filters and load, making the filter design less critical and thus less costly.

In summary, there has been disclosed a new and improved watt and var transducer which alternately generates each function in response to commonly shared time division multiplication circuitry, and yet which provides simultaneous and continuous output signals responsive to circuit watts and vars. The time division multiplication of the incorporated patent has been preserved in the new and improved transducer, as well as the current related aspect of the output signals via switching of the secondary terminals of the current transformer which provides the measurement of the circuit current.

I claim as my invention:

1. A watt and var transducer, comprising:
 means providing a first voltage signal,
 means phase shifting the first voltage signal by 90° to provide a second voltage signal,
 means providing a triangle wave signal,
 means providing first and second pulse width modulated signals in response to said first and second voltage signals, respectively, and to said triangle wave signal,
 means providing a current signal,
 means alternately modulating the current signal in response to said first and second pulse width modulated signals, to provide first and second modulated current signals, respectively,
 first and second output circuits each including filter and amplifier means,
 and means applying the first and second modulated current signals to the first and second output circuits, respectively, to simultaneously provide both watt and VAR measurements.

2. The transducer of claim 1 wherein the means which provides the triangle wave signal also provides a square wave signal from which the triangle wave signal is derived, and wherein the means which alternately modulates the current signal with the first and second pulse width modulated signals is responsive to the square wave signal.

3. The transducer of claim 2 wherein the means which applies the first and second modulated current signals to the first and second output circuits is responsive to the square wave signal.

4. The transducer of claim 1 wherein the means which provides the current signal includes a current transformer having output terminals, and the means which modulates the current signal includes first switching means which reverses the output terminals of the current transformer in response to signals applied to a control input, and second switching means for alternately applying the first and second pulse width modulated signals to the control input of the first switching means.

5. A watt and var transducer for providing both watt and var measurements simultaneously in response to the voltage and current quantities of an alternating current circuit, comprising:
 potential transformer means providing a first voltage signal responsive to the voltage quantity of the alternating current circuit,
 phase shift means shifting said first voltage by 90° to provide a second voltage signal,
 first and second comparator means providing first and second pulse width modulated signals at a predetermined frequency, responsive to said first and second voltage signals, respectively, current transformer means having output terminals providing a current signal responsive to the current quantity of the alternating current circuit, first switching means having input terminals connected to the output terminals of said current transformer means, output terminals, and control terminals, second switching means for alternately applying, at said predetermined frequency, the first and second pulse width modulated signals to the control terminals of said first switching means, such that the first switching means reverses the connection of its input terminals to its output terminals in response to the specific pulse width modulated signal being applied to the control terminals at any instant, first and second output means, and third switching means for alternately connecting the output terminals of said first switching means to said first and second output means, such that the first output means receives the current signal when the first pulse width modulated signal is controlling the switching of the first switching means, and the second output means receives the current signal when the second pulse width modulated signal is controlling the switching.

6. The transducer of claim 5 including means providing a square wave signal at the predetermined frequency and means providing a triangle wave signal in response to said square wave signal, with each of the first and second comparator means being responsive to said triangle wave signal, and with each of the second and third switching means being responsive to said square wave signal.

7. The transducer of claim 5 wherein the first and second output means each include a filter and amplifier means.

8. A watt and var transducer for providing both watt and var measurements simultaneously in response to the voltage and current quantities of an alternating current circuit, comprising:

potential transformer means providing a first voltage signal responsive to the voltage quantity of the alternating current circuit, phase shift means shifting said first voltage signal by 90° to provide a second voltage signal, square wave means providing square wave signals at a predetermined frequency, triangle wave means providing a triangle wave signal in response to said square wave means, first comparator means providing a first pulse width modulated signal in response to said first voltage signal and said triangle wave signal, second comparator means providing a second pulse width modulated signal in response to said second voltage signal and said triangle wave signal, current transformer means having output terminals, said current transformer means providing a current signal at its output terminals responsive to the current quantity of the alternating current circuit, first switching means for alternately reversing the output terminals of said current transformer means, with said first switching means having input terminals connected to the output terminals of said current transformer means, and output terminals, second switching means responsive to said square wave signals for alternately applying the first and second pulse width modulated signals to said first switching means, with the first switching means reversing the output terminals of the current transformer means in response to the specific pulse width modulated signal being applied thereto, at any instant, watt and var output means each having filter and amplifier means, and third switching means responsive to said square wave signals alternately connecting the output terminals of said first switching means to the watt and var output means.

* * * * *